US010492324B2

(12) United States Patent
Miura (10) Patent No.: US 10,492,324 B2
(45) Date of Patent: Nov. 26, 2019

(54) ELECTRONIC DEVICE (71) Applicant: FANUC CORPORATION, Yamanashi (JP)

(72) Inventor: Daisuke Miura, Yamanashi-ken (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 16/225,767

(22) Filed: Dec. 19, 2018

(65) Prior Publication Data

US 2019/0200474 A1 Jun. 27, 2019

(30) Foreign Application Priority Data

Dec. 25, 2017 (JP) ................. 2017-248031

(51) Int. Cl.
*H05K 7/14* (2006.01)
*H01R 12/72* (2011.01)
*H05K 5/00* (2006.01)
*H05K 5/02* (2006.01)

(52) U.S. Cl.
CPC ......... *H05K 7/1417* (2013.01); *H01R 12/722* (2013.01); *H05K 5/0026* (2013.01); *H05K 5/0247* (2013.01); *H05K 7/1427* (2013.01); *H05K 7/1439* (2013.01)

(58) Field of Classification Search
None
See application file for complete search history.

(56) References Cited

U.S. PATENT DOCUMENTS 6,094,349 A * 7/2000 Fassel ............... H05K 3/284
165/80.2
6,341,063 B2 * 1/2002 Kinoshita ............ H05K 5/0039
361/690
7,140,885 B2 * 11/2006 Kitamura ............ H05K 5/0039
439/76.1

(Continued)

FOREIGN PATENT DOCUMENTS

JP 722585 A 4/1995
JP 722585 U 4/1995

(Continued)

OTHER PUBLICATIONS

English Abstract and Machine Translation for Japanese Publication No. 2005-209764 A, published Aug. 4, 2005, 8 pgs.

(Continued)

*Primary Examiner* — Xanthia C Cunningham
(74) *Attorney, Agent, or Firm* — Fredrikson & Byron, P.A.

(57) ABSTRACT

In an electronic device, pairs of fixing jigs are provided on an extraction side of pairs of guide rails and extend in an extraction direction respectively along both ends of a circuit board. The fixing jigs of each pair are disposed on the sides of both surfaces of the circuit board such that their distal ends are spaced at a second interval longer than a first interval. Pairs of jig guiding portions are provided on a faceplate and extend in an insertion direction respectively along both ends of the circuit board. The jig guiding portions of each pair are disposed on the sides of both surfaces of the circuit board such that their distal ends are spaced at a third interval longer than the sum of the second interval and the thicknesses of the distal ends of the pair of fixing jigs.

9 Claims, 5 Drawing Sheets

(56) References Cited

U.S. PATENT DOCUMENTS

| | | | |
|---|---|---|---|
| 7,417,868 B2* | 8/2008 | Morisada | H05K 7/1405 361/741 |
| 8,523,581 B2* | 9/2013 | Martin | H01R 12/724 439/83 |
| 9,493,126 B2* | 11/2016 | Yang | B60R 16/0239 |
| 9,967,993 B1* | 5/2018 | Walker | H05K 5/0221 |
| 2001/0017767 A1* | 8/2001 | Kitamura | H05K 5/0039 361/752 |
| 2004/0089826 A1* | 5/2004 | Yonekawa | G03B 42/04 250/584 |
| 2010/0226099 A1* | 9/2010 | Kondou | H05K 7/1489 361/724 |
| 2016/0095233 A1* | 3/2016 | Kusumi | H05K 7/1405 361/756 |
| 2017/0059781 A1* | 3/2017 | Fortusini | G02B 6/32 |

FOREIGN PATENT DOCUMENTS

| | | |
|---|---|---|
| JP | 8125358 A | 5/1996 |
| JP | 2002246772 A | 8/2002 |
| JP | 2005209764 A | 8/2005 |

OTHER PUBLICATIONS

English Abstract and Machine Translation for Japanese Publication No. 2002-246772 A, published Aug. 30, 2002, 7 pgs.
English Abstract and Machine Translation for Japanese Publication No. 08-125358 A, published May 17, 1996, 6 pgs.
English Machine Translation for Japanese Publication No. 07-022585 A, published Apr. 21, 1995, 7 pgs.
English Machine Translation for Japanese Publication No. 07-022585 U, published Apr. 21, 1995, 7 pgs.

* cited by examiner

ELECTRONIC DEVICE

CROSS-REFERENCE TO RELATED APPLICATION

This application is based upon and claims the benefit of priority from Japanese Patent Application No. 2017-248031 filed on Dec. 25, 2017, the contents of which are incorporated herein by reference.

BACKGROUND OF THE INVENTION

Field of the Invention

The present invention relates to an electronic device in which a circuit board is inserted into a slot of a casing so as to fit together a first connector on the side of the circuit board and a second connector in the casing.

Description of the Related Art

Japanese Laid-Open Patent Publication No. 2002-246772 discloses an electronic device including a casing in which a slot is provided, a circuit board that is inserted in the slot, a first connector provided at an end of the circuit board in the direction in which the circuit board is inserted, a second connector that is provided in the casing and that is fitted with the first connector when the circuit board is inserted in the slot, and a pair of guide rails extending in the insertion direction in the casing, for guiding the circuit board inserted into the slot.

SUMMARY OF THE INVENTION

In the conventional technique, the circuit board is thus fixed in the slot by fitting the first connector and the second connector together. Accordingly, when the casing or the circuit board vibrates, the fitted portion (the portion of contact) between the first connector and the second connector and the soldered portions of the second connector and the circuit board are subjected to loads.

Accordingly, an object of the present invention is to provide an electronic device in which a circuit board inserted in a slot of a casing is securely fixed so as to ensure vibration resistance.

According to an aspect of the present invention, an electronic device includes a casing, a circuit board, a first connector, a faceplate, a second connector, pairs of guide rails, pairs of fixing jigs, and pairs of jig guiding portions.

A slot is provided in the casing and the circuit board is inserted in the slot. The first connector is provided at an end of the circuit board in an insertion direction. The faceplate is provided at an end of the circuit board in an extraction direction opposite to the insertion direction, and supports the circuit board. The second connector is provided in the casing and configured to be fitted to the first connector when the circuit board is inserted in the slot.

The pairs of guide rails are provided in the slot and extend in the insertion direction respectively on the sides of both ends of the circuit board which are spaced in a direction intersecting the insertion direction, so as to guide insertion of the circuit board into the slot. The guide rails of each pair are disposed at a first interval on the respective sides of both surfaces of the circuit board.

The pairs of fixing jigs are provided on an extraction side of the pairs of guide rails and extend in the extraction direction respectively on the sides of both ends of the circuit board, so as to fix the circuit board in the slot. The fixing jigs of each pair are disposed on the sides of both surfaces of the circuit board in such a manner that the distal ends of the fixing jigs of the pair are spaced at a second interval that is longer than the first interval.

The pairs of jig guiding portions are provided on the faceplate. The pairs of jig guiding portions extend in the insertion direction respectively on the sides of both ends of the circuit board, so as to elastically deform the pairs of fixing jigs in order to fix the circuit board when the circuit board is inserted into the slot. The jig guiding portions of each pair are disposed on the respective sides of both surfaces of the circuit board in such a manner that the distal ends of jig guiding portions of the pair are spaced at a third interval that is longer than a sum of the second interval and the thicknesses of the distal ends of fixing jigs of the pair.

According to the present invention, when the circuit board is inserted into the slot, the pairs of jig guiding portions provided integrally with the circuit board via the faceplate elastically deform the pairs of fixing jigs toward both surfaces of the circuit board, and hold and sandwich the pairs of fixing jigs and the circuit board therebetween. The circuit board is thus pressed on both its surfaces by the pairs of jig guiding portions and the pairs of fixing jigs. As a result, it is possible to securely fix the circuit board inserted in the slot of the casing to thereby ensure vibration resistance.

The above and other objects, features, and advantages of the present invention will become more apparent from the following description when taken in conjunction with the accompanying drawings, in which preferred embodiments of the present invention are shown by way of illustrative example.

DESCRIPTION OF THE PREFERRED EMBODIMENTS

The electronic device according to the present invention will be described in detail below with reference to the accompanying drawings in conjunction with a preferred embodiment.

Schematic Configuration of Preferred Embodiment

Figure 1:
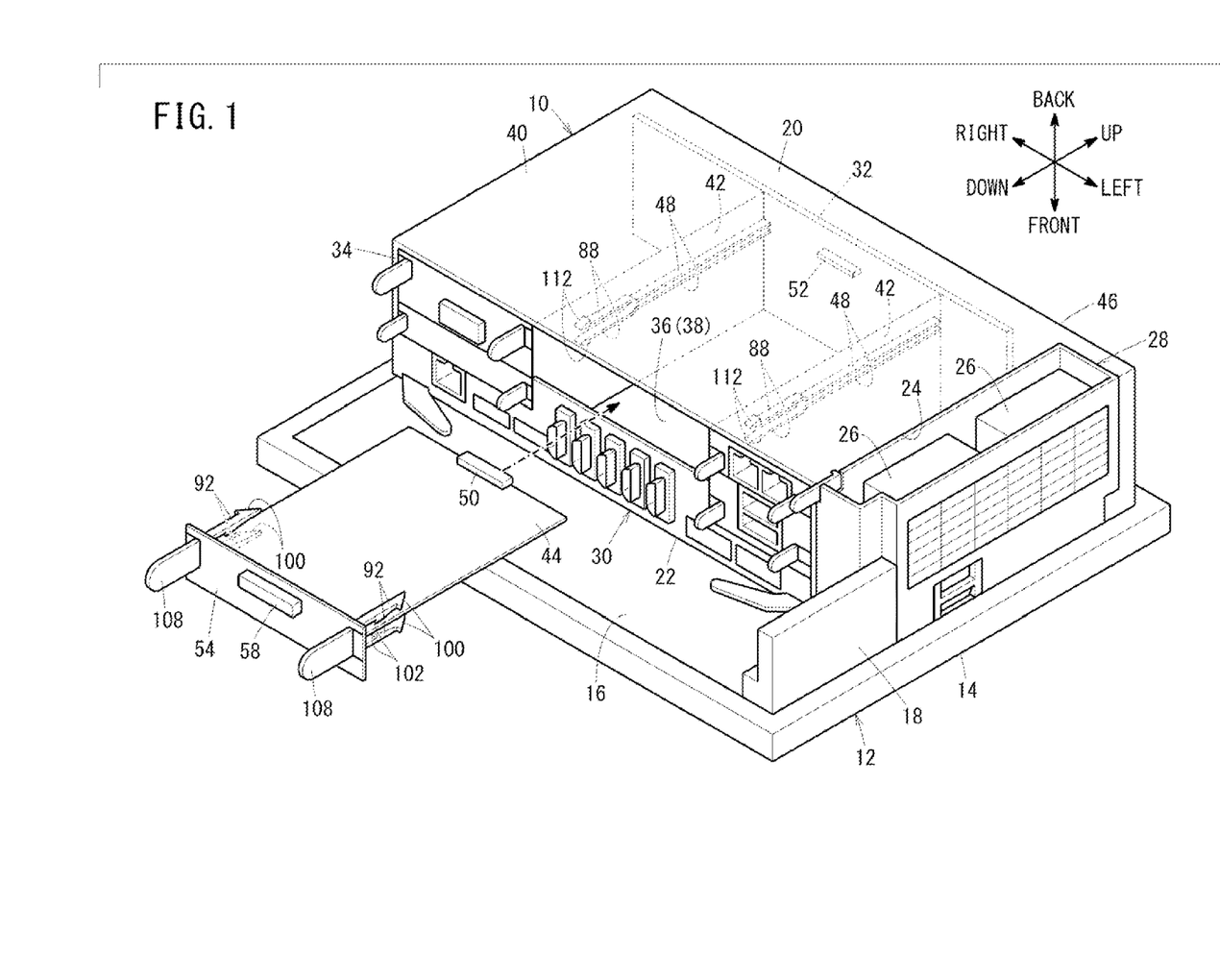
FIG. 1 is a perspective view showing an electronic device according to an embodiment of the present invention.

As shown in FIG. 1, an electronic device 10 of this embodiment is applied to a control device for controlling an indicator 12 and a non-illustrated industrial machine (e.g., a machine tool, robot, injection molding machine, wire electric discharge machine, etc.), for example. The indicator 12 is a liquid crystal display unit having a display screen (not shown) disposed on a front surface 14 thereof. The indicator 12 may be other type of display unit. FIG. 1 shows a case in which the electronic device 10 is applied to a numerical control device for a CNC (Computerized Numerical Control) machine tool. In this case, the indicator 12 is provided in a control panel of the machine tool. In the description below, it should be noted that the directions will be indicated as up-down, right-left, and front-back seen from the front of the display screen of the indicator 12.

The electronic device 10 and a user interface unit 18, which is connectable to external equipment (not shown), are detachably mounted on a back surface 16 of the indicator 12 which is opposite to the front surface 14. In this case, on the back surface 16 of the indicator 12, the electronic device 10 is detachably mounted on a top side of the back surface 16 of the indicator 12. Also, on the back surface 16 of the indicator 12, the user interface unit 18 is detachably mounted in a corner on a lower side.

The electronic device 10 includes a box-shaped casing 20 which is detachably attached to the back surface 16 of the indicator 12. A bottom surface 22 of the casing 20 faces the back surface 16 of the indicator 12. Among the side surfaces of the casing 20 that adjoin the bottom surface 22, a fan unit 28 accommodating two fans 26 for cooling the interior of the casing 20 is detachably mounted to a side surface 24 of the casing 20 that is disposed closer to the user interface unit 18 and that extends in the up-down direction. The fan unit 28 may include at least a single fan 26.

As shown in FIGS. 1 to 5, the electronic device 10 includes the casing 20, a control unit 30 accommodated in the casing 20 and configured to control the indicator 12 and an industrial machine, and a back plate 32 accommodated in the casing 20 and connected to the control unit 30. Among the side surfaces of the casing 20 that adjoin the bottom surface 22 thereof, the under surface (a lower surface 34) adjoining the side surface 24, to which the fan unit 28 is attached, has a plurality of openings 36 with different shapes or sizes.

Inside the casing 20, a plurality of slots 38 are formed which extend from the respective openings 36 in the up-down direction parallel to the side surface 24 to which the fan unit 28 is attached. That is to say, inside the casing 20, a plurality of partition plates 42 extend to the bottom surface 22 of the casing 20 from a top plate 40 thereof opposite to the back surface 16 of the indicator 12. The casing 20 is thus partitioned into a plurality of spaces. Each of the plurality of divided spaces is formed as a slot 38, each slot 38 having an opening 36 formed on the side of the lower surface 34. Thus, all the slots 38 are provided in the lower surface 34 of the casing 20. In this embodiment, a plurality of partition plates that extend in the right-left direction may be further provided, and then the space in the casing 20 is divided in the front-back direction to form a plurality of slots 38.

The back plate 32 is a connection board connected to a plurality of circuit boards 44 constituting the control unit 30. The back plate 32 is disposed on the depth side in the direction to the upper side of the casing 20 (in the direction in which the circuit boards 44 are inserted), i.e., on the depth side in the direction to the upper side of the plurality of slots 38. The back plate 32 extends in parallel with the side surface of the casing 20 on the upper side (an upper surface 46 thereof) and perpendicularly to its bottom surface 22. The back plate 32 is connected to the indicator 12 through a connector (not shown).

The control unit 30 includes the plurality of circuit boards 44 accommodated respectively in the plurality of slots 38 in an insertable and extractable manner. The plurality of circuit boards 44 may have electronic components (not shown) mounted thereon. The plurality of slots 38 (openings 36) have different shapes or sizes from each other, and hence the plurality of circuit boards 44 have shapes or sizes corresponding to the shapes or sizes of the openings 36 so that the plurality of circuit boards 44 can be inserted into the corresponding ones of the slots 38. FIGS. 1 to 5 show an example in which a corresponding circuit board 44 is inserted into and extracted from one slot 38. For the sake of simplicity of description, FIGS. 4 and 5 only show part of the configuration.

In the casing 20, pairs of guide rails 48 are provided which extend in the up-down direction on the respective right and left sides of each slot 38 (on the sides of both ends of the circuit board 44 spaced in the right-left direction that intersects the insertion direction). On the partition plates 42 and the inner walls forming the sides of the casing 20, two guide rails 48 of each pair are spaced at a first interval d1 in the front-back direction of the casing 20 (on both surface sides of the circuit board 44). Thus, the pairs of guide rails 48 can guide the circuit board 44, inserted in the slot 38, in the insertion direction to the back plate 32, with both ends of the circuit board 44 fitted in the grooves between the pairs of guide rails 48. Further, the use of the pairs of guide rails 48 eliminates the need to position the circuit board 44 in the front-back direction and right-left direction when the circuit board 44 is inserted into the slot 38.

A first connector 50 is provided at an end of the circuit board 44 that is closer to the back plate 32 (at the end in the direction in which the circuit board 44 is inserted). Further, on the back plate 32, a plurality of second connectors 52 are provided which respectively fit to the first connectors 50 when the circuit boards 44 are inserted respectively in the plurality of slots 38. In this way, when accommodated in the slots 38, the circuit boards 44 can control the indicator 12 through the first connectors 50 and the second connectors 52 in the fitted state and the back plate 32. In FIG. 1, the configuration of the interior of the slot 38 is shown by broken line etc. for a case in which a circuit board 44 is inserted into and extracted from one slot 38.

Further, a faceplate 54 supporting the circuit board 44 is provided at the end of the direction in which the circuit board 44 is extracted (i.e., in the downward direction), which is opposite to the insertion direction. When the circuit board 44 has been inserted in the slot 38, the faceplate 54 abuts on the lower surface 34 of the casing 20 and closes the opening 36.

Figure 2:
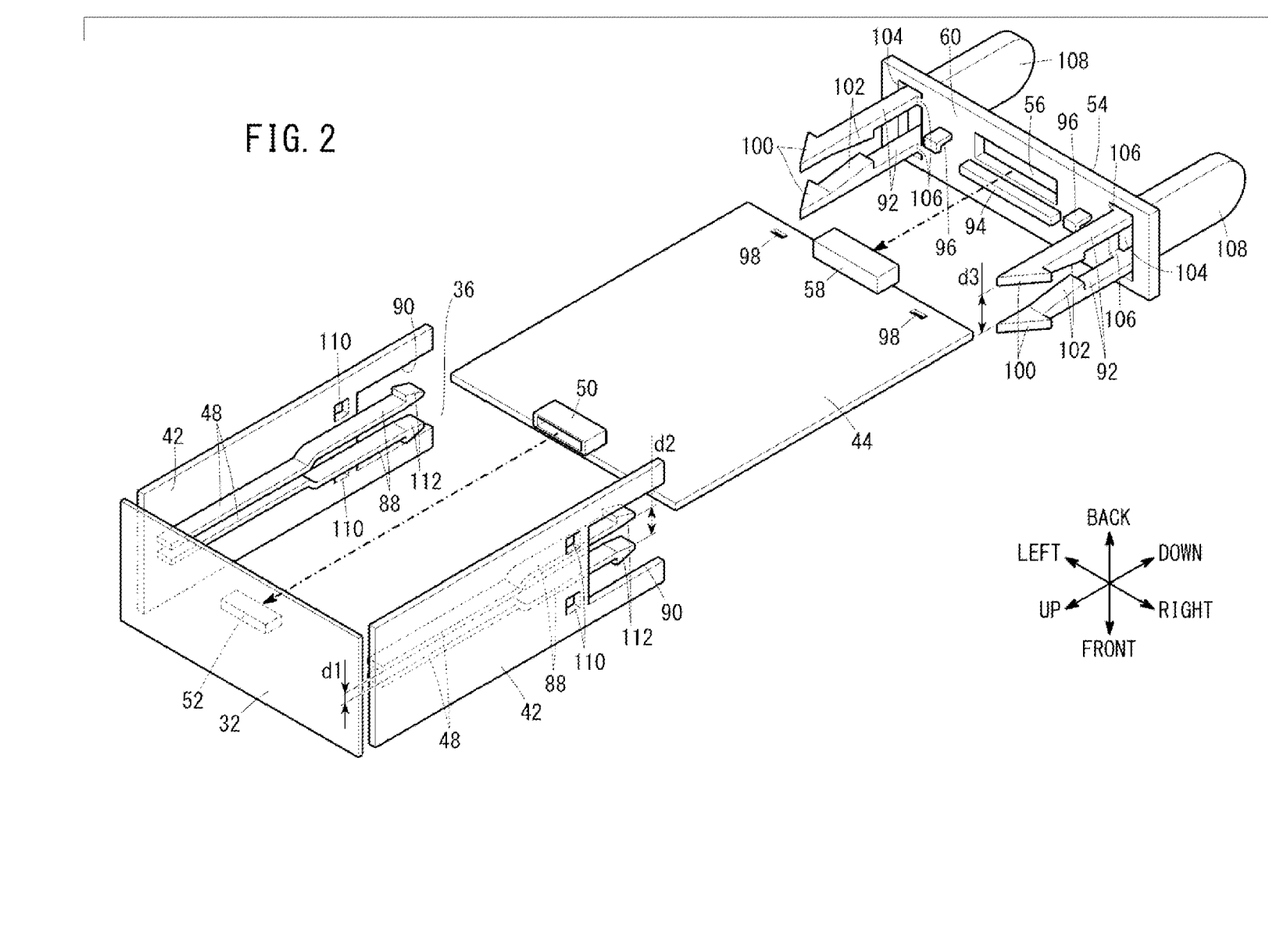
FIG. 2 is an exploded perspective view showing the configuration of a part of the electronic device of FIG. 1.
Figure 3:
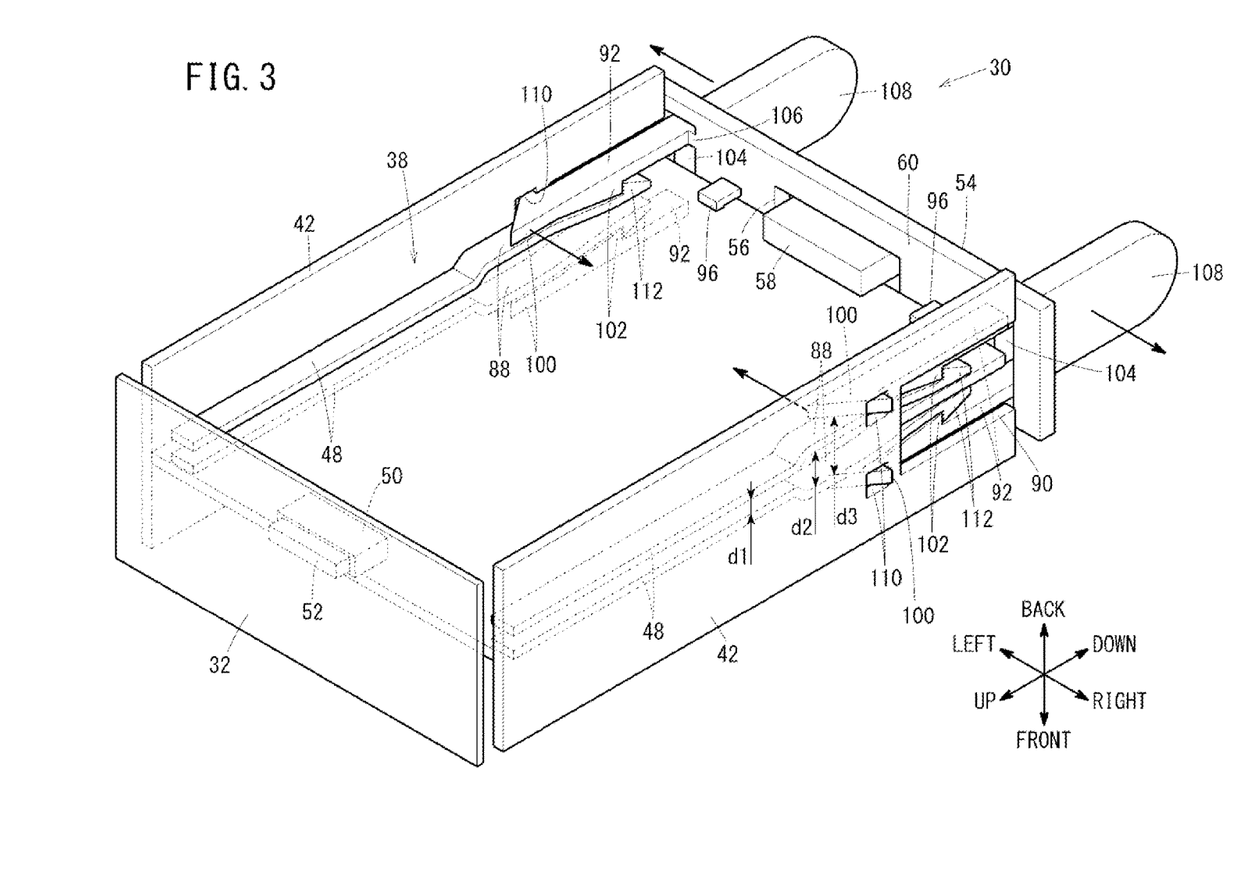
FIG. 3 is a perspective view schematically showing insertion of a circuit board into a slot.

Furthermore, as shown in FIGS. 1 to 3, a third connector 58 is provided at the end of the direction of extraction of the circuit board 44. The third connector 58 is exposed to the exterior through an opening 56 formed in the faceplate 54. The third connector 58 can be connected to an external connector. This makes it possible to supply signals from the outside to the circuit board 44 through the third connector 58, or to output signals from the circuit board 44 to the outside through the third connector 58.

In this way, by making the circuit board 44 as a unit, the circuit board 44 can be easily packaged and carried about, and measures against static electricity can be easily taken for the circuit board 44.

Characteristic Features of Present Embodiment

Next, characteristic features of the electronic device 10 of this embodiment will be described with reference to FIGS. 1 to 5. The electronic device 10 further includes the features described below in order to suppress vibration of the circuit board 44 accommodated in the slot 38, when the circuit board 44 is inserted in the slot 38 and the first connector 50 and the second connector 52 are fitted together.

Pairs of fixing jigs 88 extending in the extraction direction are provided on the extraction side of the pairs of guide rails 48, respectively on the sides of both ends of the circuit board 44 in the slot 38. Each pair of fixing jigs 88 are disposed on the extraction side of the pair of guide rails 48 such that the distal ends thereof are spaced at a second interval d2 longer than the first interval d1 on the sides of both surfaces of the circuit board 44. Further, cut portions 90 are formed along the up-down direction in portions of the partition plates 42 that correspond to the pairs of fixing jigs 88 so that the pairs of fixing jigs 88 can be deformed elastically (see FIGS. 2 to 4).

On the surface of the faceplate 54 on the insertion side (a top surface 60 thereof), pairs of jig guiding portions 92 are provided which extend in the insertion direction respectively along both ends of the circuit board 44. The pairs of jig guiding portions 92 are elastically deformable. A third interval d3 between the distal ends of the jig guiding portions 92 of each pair is set to be longer than the sum of the thicknesses of the distal ends of the pair of fixing jigs 88 and the second interval d2 between the paired fixing jigs 88 before deformed elastically (see FIG. 2). Accordingly, when the circuit board 44 is inserted into the slot 38, the pair of fixing jigs 88 can be inserted between the pair of jig guiding portions 92 and both surfaces of the circuit board 44 (see FIGS. 3 to 5). If the distal ends of the pair of fixing jigs 88 are formed in a protruding form and the thickness of the distal ends of the pair of fixing jigs 88 is zero, then it is sufficient to set the third interval d3 to be longer than the second interval d2.

Further, on the surface of the faceplate 54 on the insertion side (the top surface 60), a supporting portion 94 protruding in the insertion direction is provided in front of the opening 56 (see FIG. 2). Also, on the top surface 60, L-shaped engaging portions 96 are provided respectively on the sides of both ends of the circuit board 44 (see FIGS. 2 and 3). Provided at the end of the circuit board 44 on the extraction side are two engaging portions 98 which are recesses facing respectively to the two engaging portions 96 and provided on both sides of the third connector 58. The circuit board 44 is supported by the faceplate 54 in a state in which the end of the circuit board 44 on the extraction side is in contact with the top surface 60 of the faceplate 54 and supported by the supporting portion 94, and in which the two engaging portions 96 and the two engaging portions 98 engage with each other. Thus, in the side view of FIG. 4, the circuit board 44 is supported by the faceplate 54 such that the circuit board 44 extends in the insertion direction between the pairs of jig guiding portions 92.

Further, as shown in FIGS. 1 to 5, a pair of first stoppers 100, as claws protruding outward in the right-left direction of the faceplate 54 (away from the third connector 58), are formed at the distal ends of each pair of jig guiding portions 92. Also, on each pair of jig guiding portions 92, a pair of second stoppers 102, as tapered claws protruding respectively toward both surfaces of the circuit board 44, are formed between the first stoppers 100 and the top surface 60.

The top surface 60 of the faceplate 54 has openings 104 formed respectively on the sides of both ends of the circuit board 44. In each of the two openings 104, a pair of supporting portions 106 are provided which extend outward in the right-left direction of the faceplate 54. The pairs of jig guiding portions 92 extend in the insertion direction in a state in which their proximal ends are supported respectively by the supporting portions 106.

Figure 5:
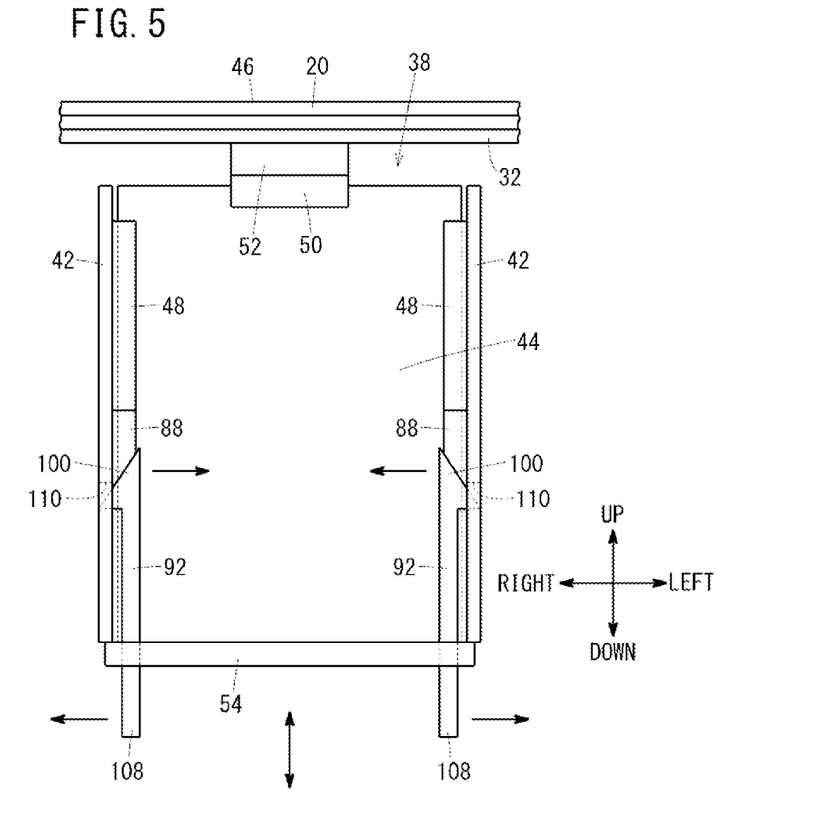
FIG. 5 is a schematic plan view showing the insertion of a circuit board into a slot.

Manipulated portions (first to third manipulated portions) 108 extending in the extraction direction are coupled to the pairs of supporting portions 106. The pairs of jig guiding portions 92 and the manipulated portions 108 are thus coupled in the up-down direction via the pairs of supporting portions 106. As shown in FIGS. 3 and 5, when an operator manipulates the manipulated portions 108 in the right-left direction, the pairs of supporting portions 106 bend, and the pairs of jig guiding portions 92 turn in a direction opposite to the movement of the manipulated portions 108. For example, when the two manipulated portions 108 are turned outward in the right-left direction of the faceplate 54 about the pairs of supporting portions 106, then the pairs of jig guiding portions 92 are turned inward in the right-left direction of the faceplate 54 about the pairs of supporting portions 106.

In correspondence with the configuration of the faceplate 54 side described above, the slot 38 side is configured as described below. That is, as shown in FIGS. 2 to 5, pairs of first engaging portions 110, as engaging holes engaging with the pairs of first stoppers 100, are formed in the slot 38 respectively on the sides of both ends of the circuit board 44. Also, as shown in FIGS. 1 to 5, at the distal ends of the pairs of fixing jigs 88, pairs of second engaging portions 112, as tapered claws engaging with the pairs of second stoppers 102, protrude outward in the front-back direction of the slot 38 (away from both surfaces of the circuit board 44). Therefore, the thicknesses at the distal ends of each pair of fixing jigs 88 described above correspond to the thicknesses including those of the second engaging portions 112. The first engaging portions 110 and the second engaging portions 112 are located in such positions that the first connector 50 and the second connector 52 fit together and the faceplate 54 closes the opening 36, when the circuit board 44 is inserted in the slot 38, the first stoppers 100 and the first engaging portions 110 engage with each other, and the second stoppers 102 and the second engaging portions 112 engage with each other.

Insertion/Extraction of Circuit Board 44 into/from Slot 38

Next, the process of inserting and extracting the circuit board 44 into and from the slot 38 will be described. First, a case of inserting the circuit board 44 into the slot 38 will be described.

When the circuit board 44 is supported by the faceplate 54, the circuit board 44 is inserted into the slot 38 with the first connector 50 directed to the insertion side. Then, both ends of the circuit board 44, on the insertion side, are put between the pairs of guide rails 48 through the pairs of fixing jigs 88. As a result, the circuit board 44 can be moved toward the back plate 32, with both ends of the circuit board 44 being guided by the pairs of guide rails 48. That is to say, the circuit board 44 is inserted into the slot 38 while being positioned in the right-left direction and the front-back direction by the pairs of guide rails 48.

As has been described earlier, the third interval d3 at the distal ends of the pair of jig guiding portions 92 is longer than the sum of the second interval d2 between the paired fixing jigs 88 and the thicknesses at the distal ends of the pair of fixing jigs 88. Accordingly, as the circuit board 44 is inserted, the pairs of fixing jigs 88 are inserted respectively between the pairs of jig guiding portions 92 and both surfaces of the circuit board 44.

When the circuit board 44 is inserted further forward, the pairs of second stoppers 102 abut on the pairs of second engaging portions 112, and the tapered portions of the second stoppers 102 and the tapered portions of the second engaging portions 112 come in contact with each other. At this time, when the circuit board 44 is pushed in the insertion direction, a pressing force acts from the tapered portions of the second stoppers 102 onto the tapered portions of the second engaging portions 112. Thus, the distal ends of the pairs of fixing jigs 88 deform elastically toward both surfaces of the circuit board 44 about the proximal ends of the pairs of fixing jigs 88.

Figure 4:
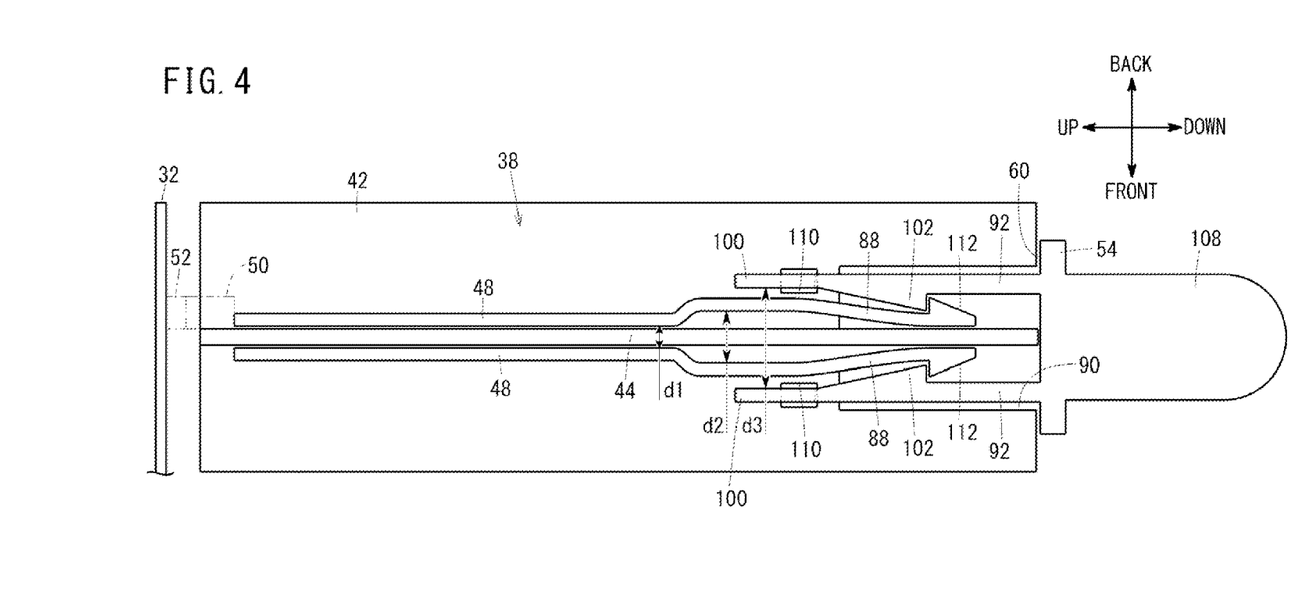
FIG. 4 is a side view schematically showing the insertion of a circuit board into a slot.

Subsequently, as the circuit board 44 is inserted further forward, the pairs of second engaging portions 112 are released from the pressing force, and the pairs of fixing jigs 88 attempt to return to the original positions by a restoring force by elastic deformation. As shown in FIGS. 3 and 4, the pairs of second stoppers 102 and the pairs of second engaging portions 112 are thus engaged together. In this case, the pairs of jig guiding portions 92 hold and sandwich the pairs of fixing jigs 88 and the circuit board 44 therebetween in the front-back direction through the pairs of second stoppers 102 and the pairs of second engaging portions 112. The circuit board 44 is thus positioned and fixed in the front-back direction in the slot 38. Further, the circuit board 44 is positioned and fixed also in the up-down direction through the engagement between the pairs of second stoppers 102 and the pairs of second engaging portions 112.

Furthermore, the pairs of first stoppers 100 engage with the pairs of first engaging portions 110. The circuit board 44 is thus positioned and fixed in the right-left direction. Still further, the first connector 50 and the second connector 52 fit together as the end of the circuit board 44 on the insertion side comes near the back plate 32. Moreover, the faceplate 54 closes the opening 36 of the slot 38.

In this way, when accommodated in the slot 38, the circuit board 44 is positioned and fixed in the front-back direction, the up-down direction, and the right-left direction. This effectively suppresses vibration of the circuit board 44. Consequently, it is possible to prevent loads from being applied to the fitted portion (the portion of contact) between the first connector 50 and the second connector 52 and the soldered portions of the second connector 52 and the circuit board 44.

On the other hand, when the circuit board 44 is extracted from the slot 38, the operator first manipulates the two manipulated portions 108, which are exposed to outside from the faceplate 54, outward in the right-left direction of the faceplate 54. Then, the supporting portions 106 bend and the pairs of jig guiding portions 92 turn inward in the right-left direction of the faceplate 54 about the supporting portions 106. As a result, the engagement between the first stoppers 100 and the first engaging portions 110 is released, and the engagement between the second stoppers 102 and the second engaging portions 112 is also released.

Next, while holding the two manipulated portions 108 outward in the right-left direction of the faceplate 54, the operator pulls the faceplate 54 in the extraction direction. As a result, the fitted state between the first connector 50 and the second connector 52 is released. As the operator further pulls the faceplate 54, the circuit board 44 can be pulled out from the opening 36 of the slot 38 with both ends of the circuit board 44 being guided by the pairs of guide rails 48.

Modifications of Embodiment

In the electronic device 10, the pairs of jig guiding portions 92 may be provided only with the second stoppers 102, and the first engaging portions 110 of the slot 38 may be omitted. Alternatively, the pairs of jig guiding portions 92 may be provided only with the first stoppers 100, and the second engaging portions 112 in the slot 38 may be omitted. In either case, the circuit board 44 inserted in the slot 38 can be positioned and fixed in the slot 38.

Technical Concepts Obtained from Embodiment

Technical concepts offered by the above-described embodiment will be described below.

The electronic device (10) includes a casing (20), a circuit board (44), a first connector (50), a faceplate (54), a second connector (52), pairs of guide rails (48), pairs of fixing jigs (88), and pairs of jig guiding portions (92).

A slot (38) is provided in the casing (20), and the circuit board (44) is inserted in the slot (38). The first connector (50) is provided at an end of the circuit board (44) in an insertion direction. The faceplate (54) is provided at an end of the circuit board (44) in an extraction direction opposite to the insertion direction, and supports the circuit board (44). The second connector (52) is provided in the casing (20) and configured to be fitted to the first connector (50) when the circuit board (44) is inserted in the slot (38).

The pairs of guide rails (48) are provided in the slot (38) and extend in the insertion direction respectively on the sides of both ends of the circuit board (44) which are spaced in a direction intersecting the insertion direction, so as to guide insertion of the circuit board (44) into the slot (38). The guide rails (48) of each pair are disposed at a first interval (d1) on the respective sides of both surfaces of the circuit board (44).

The pairs of fixing jigs (88) are provided on an extraction side of the pairs of guide rails (48) and extend in the extraction direction respectively on the sides of both ends of the circuit board (44), so as to fix the circuit board (44) in the slot (38). The fixing jigs (88) of each pair are disposed on the sides of both surfaces of the circuit board (44) in such a manner that the distal ends of the fixing jigs (88) of the pair are spaced at a second interval (d2) that is longer than the first interval (d1).

The pairs of jig guiding portions (92) are provided on the faceplate (54). The pairs of jig guiding portions (92) extend in the insertion direction respectively on the sides of both ends of the circuit board (44), so as to elastically deform the pairs of fixing jigs (88) in order to fix the circuit board (44) when the circuit board (44) is inserted into the slot (38). The jig guiding portions (92) of each pair are disposed on the respective sides of both surfaces of the circuit board (44) in such a manner that the distal ends of the jig guiding portions (92) of the pair are spaced at a third interval (d3) that is longer than a sum of the second interval (d2) and the thicknesses of the distal ends of the fixing jigs (88) of the pair.

In accordance with this configuration, when the circuit board (44) is inserted into the slot (38), the pairs of jig guiding portions (92) provided integrally with the circuit board (44) through the faceplate (54) elastically deform the pairs of fixing jigs (88) toward both surfaces of the circuit board (44), and hold and sandwich the pairs of fixing jigs (88) and the circuit board (44) therebetween. The circuit board (44) is thus pressed on both its surfaces by the pairs of jig guiding portions (92) and the pairs of fixing jigs (88). As a result, it is possible to securely fix the circuit board (44) inserted in the slot (38) of the casing (20) to thereby ensure vibration resistance.

The electronic device (10) further includes pairs of first stoppers (100) provided on the pairs of jig guiding portions (92) and protruding in the direction intersecting the insertion direction, respectively on the sides of both ends of the circuit board (44), and pairs of first engaging portions (110) provided in the slot (38) and configured to engage with the pairs of first stoppers (100) respectively on the sides of both ends of the circuit board (44). In accordance with this configuration, the circuit board (44) accommodated in the slot (38) can be easily positioned and fixed in the direction intersecting the insertion direction.

The electronic device (10) further includes first manipulated portions (108) provided on the faceplate (54) and configured to release an engaged state between the pairs of first stoppers (100) and the pairs of first engaging portions (110) respectively on the sides of both ends of the circuit board (44). In accordance with this configuration, the circuit board (44) accommodated in the slot (38) can be easily extracted from the slot (38).

The electronic device (10) further includes pairs of second stoppers (102) provided on the pairs of jig guiding portions (92) and protruding toward both surfaces of the circuit board (44), respectively on the sides of both ends of the circuit board (44), and pairs of second engaging portions (112) provided on the pairs of fixing jigs (88) and configured to engage with the pairs of second stoppers (102) respectively on the sides of both ends of the circuit board (44). In accordance with this configuration, the circuit board (44) accommodated in the slot (38) can be easily positioned and fixed in the insertion direction and on the sides of both surfaces of the circuit board (44).

The electronic device (10) further includes second manipulated portions (108) provided on the faceplate (54) and configured to release an engaged state between the pairs of second stoppers (102) and the pairs of second engaging portions (112) respectively on the sides of both ends of the circuit board (44). In this case, too, the circuit board (44) accommodated in the slot (38) can be easily extracted from the slot (38).

The electronic device (10) further includes pairs of first stoppers (100) provided on the pairs of jig guiding portions (92) and protruding in the direction intersecting the insertion direction, respectively on the sides of both ends of the circuit board (44), pairs of second stoppers (102) provided on the pairs of jig guiding portions (92) and protruding toward both surfaces of the circuit board (44), respectively on the sides of both ends of the circuit board (44), pairs of first engaging portions (110) provided in the slot (38) and configured to engage with the pairs of first stoppers (100) respectively on the sides of both ends of the circuit board (44), and pairs of second engaging portions (112) provided on the pairs of fixing jigs (88) and configured to engage with the pairs of second stoppers (102) respectively on the sides of both ends of the circuit board (44). In accordance with this configuration, the circuit board (44) accommodated in the slot (38) can be easily positioned and fixed in the insertion direction and the direction intersecting the insertion direction, and on the sides of both surfaces of the circuit board (44).

The electronic device (10) further includes third manipulated portions (108) provided on the faceplate (54) and configured to release an engaged state between the pairs of first stoppers (100) and the pairs of first engaging portions (110) and an engaged state between the pairs of second stoppers (102) and the pairs of second engaging portions (112), respectively on the sides of both ends of the circuit board (44). In this case, too, the circuit board (44) accommodated in the slot (38) can be easily extracted from the slot (38).

The electronic device (10) further includes a back plate (32) which is provided in the casing (20) and on which the second connector (52) is disposed. In accordance with this configuration, it is possible to perform transmission and reception of signals between the circuit board (44) and the back plate (32) when the circuit board (44) is inserted in the slot (38) and the first connector (50) and the second connector (52) are fitted together.

The electronic device (10) further includes a third connector (58) provided at the end of the circuit board (44) in the extraction direction. In accordance with this configuration, it is possible to supply signals from the outside to the circuit board (44) through the third connector (58), or to output signals to the outside from the circuit board (44) through the third connector (58).

The present invention is not particularly limited to the embodiments described above, and various modifications are possible without departing from the essence and gist of the present invention.

What is claimed is:

1. An electronic device, comprising:
   a casing in which a slot is provided;
   a circuit board configured to be inserted in the slot;
   a first connector provided at an end of the circuit board in an insertion direction;
   a faceplate provided at an end of the circuit board in an extraction direction opposite to the insertion direction and configured to support the circuit board;
   a second connector provided in the casing and configured to be fitted to the first connector when the circuit board is inserted in the slot;
   pairs of guide rails provided in the slot and extending in the insertion direction respectively on sides of both ends of the circuit board which are spaced in a direction intersecting the insertion direction, so as to guide insertion of the circuit board into the slot, the guide rails of each pair being disposed at a first interval on respective sides of both surfaces of the circuit board;
   pairs of fixing jigs provided on an extraction side of the pairs of guide rails and extending in the extraction direction respectively on the sides of both ends of the circuit board, so as to fix the circuit board in the slot, the fixing jigs of each pair being disposed on the sides of both surfaces of the circuit board in a manner that distal ends of the fixing jigs of the pair are spaced at a second interval that is longer than the first interval; and
   pairs of jig guiding portions provided on the faceplate and extending in the insertion direction respectively on the sides of both ends of the circuit board, so as to elastically deform the pairs of fixing jigs in order to fix the circuit board when the circuit board is inserted into the slot, the jig guiding portions of each pair being disposed on the respective sides of both surfaces of the circuit board in a manner that distal ends of the jig guiding portions of the pair are spaced at a third interval that is longer than a sum of the second interval and thicknesses of the distal ends of the fixing jigs of the pair.

2. The electronic device according to claim 1, further comprising:
   pairs of first stoppers provided on the pairs of jig guiding portions and protruding in the direction intersecting the insertion direction, respectively on the sides of both ends of the circuit board; and
   pairs of first engaging portions provided in the slot and configured to engage with the pairs of first stoppers respectively on the sides of both ends of the circuit board.

3. The electronic device according to claim 2, further comprising first manipulated portions provided on the faceplate and configured to release an engaged state between the pairs of first stoppers and the pairs of first engaging portions respectively on the sides of both ends of the circuit board.

4. The electronic device according to claim 1, further comprising,
pairs of second stoppers provided on the pairs of jig guiding portions and protruding toward both surfaces of the circuit board, respectively on the sides of both ends of the circuit board, and
pairs of second engaging portions provided on the pairs of fixing jigs and configured to engage with the pairs of second stoppers respectively on the sides of both ends of the circuit board.

5. The electronic device according to claim 4, further comprising second manipulated portions provided on the faceplate and configured to release an engaged state between the pairs of second stoppers and the pairs of second engaging portions respectively on the sides of both ends of the circuit board.

6. The electronic device according to claim 1, further comprising:
pairs of first stoppers provided on the pairs of jig guiding portions and protruding in the direction intersecting the insertion direction, respectively on the sides of both ends of the circuit board;
pairs of second stoppers provided on the pairs of jig guiding portions and protruding toward both surfaces of the circuit board, respectively on the sides of both ends of the circuit board;
pairs of first engaging portions provided in the slot and configured to engage with the pairs of first stoppers respectively on the sides of both ends of the circuit board; and
pairs of second engaging portions provided on the pairs of fixing jigs and configured to engage with the pairs of second stoppers respectively on the sides of both ends of the circuit board.

7. The electronic device according to claim 6, further comprising third manipulated portions provided on the faceplate and configured to release an engaged state between the pairs of first stoppers and the pairs of first engaging portions and an engaged state between the pairs of second stoppers and the pairs of second engaging portions, respectively on the sides of both ends of the circuit board.

8. The electronic device according to claim 1, further comprising a back plate which is provided in the casing and on which the second connector is disposed.

9. The electronic device according to claim 1, further comprising a third connector provided at the end of the circuit board in the extraction direction.

* * * * *